(12) United States Patent
Legall et al.

(10) Patent No.: US 11,994,569 B2
(45) Date of Patent: May 28, 2024

(54) RADIO FREQUENCY COIL ASSEMBLIES FOR MAGNETIC RESONANCE IMAGING SYSTEMS AND METHODS FOR MAKING THEM

(71) Applicant: GE Precision Healthcare LLC, Wauwatosa, WI (US)

(72) Inventors: Edwin L. Legall, North Prairie, WI (US); Louis J. Vannatta, Crystal Lake, IL (US); Gaines Hartley, Florence, SC (US); William J. Bonneau, Waukesha, WI (US); Thomas K. Foo, Clifton Park, NY (US); Dan K. Spence, Saratoga, NY (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 17/943,911

(22) Filed: Sep. 13, 2022

(65) Prior Publication Data
US 2024/0085505 A1 Mar. 14, 2024

(51) Int. Cl.
*G01R 33/385* (2006.01)
*G01R 33/34* (2006.01)
*G01R 33/38* (2006.01)
*H01F 6/06* (2006.01)

(52) U.S. Cl.
CPC ... *G01R 33/3856* (2013.01); *G01R 33/34015* (2013.01); *G01R 33/3403* (2013.01); *G01R 33/3804* (2013.01); *H01F 6/06* (2013.01)

(58) Field of Classification Search
CPC ............ G01R 33/3856; G01R 33/3804; G01R 33/3403; H01F 6/06
See application file for complete search history.

(56) References Cited

U.S. PATENT DOCUMENTS

| | | | |
|---|---|---|---|
| 4,680,548 A * | 7/1987 | Edelstein | G01R 33/34076 324/318 |
| 6,469,604 B1 | 10/2002 | Palkovich et al. | |
| 6,812,705 B1 * | 11/2004 | Sellers | G01R 33/34076 324/318 |
| 7,015,692 B2 * | 3/2006 | Clarke | G01R 33/34046 324/318 |
| 7,301,343 B1 | 11/2007 | Sellers | |

(Continued)

OTHER PUBLICATIONS

Radiofrequency Coil Former Design for Positron Emission Tomography-Magnetic Resonance System, ip.com Disclosure No. IPCOM000225273D, Publication Date: Feb. 5, 2013 (Year: 2013).*

*Primary Examiner* — Daniel R Miller
(74) *Attorney, Agent, or Firm* — Andrus Intellectual Property Law, LLP

(57) ABSTRACT

A radio frequency coil assembly for an MRI system. A support structure extends between a first end and a second end in a first direction and between an inner surface and an opposite outer surface in a second direction perpendicular to the first direction. The support structure has channels that extend into the support structure in the second direction. An RF coil is configured to transmit and/or receive RF signals. The RF coil is supported by the outer surface of the support structure. The channels are at least partially positioned between the support structure and the RF coil in the first direction and are configured to convey a cooling medium to cool the support structure in use.

20 Claims, 8 Drawing Sheets

(56) References Cited

U.S. PATENT DOCUMENTS

| | | | | |
|---|---|---|---|---|
| 7,397,244 B2* | 7/2008 | Cirel | ................... | G01R 33/3856 |
| | | | | 324/318 |
| 7,489,132 B2* | 2/2009 | Arik | ................... | G01R 33/3856 |
| | | | | 324/309 |
| 7,812,604 B2* | 10/2010 | Icoz | ....................... | G01R 33/34 |
| | | | | 600/419 |
| 8,035,385 B2* | 10/2011 | Tomiha | ............ | G01R 33/34076 |
| | | | | 324/318 |
| 8,188,742 B2* | 5/2012 | Utturkar | ............ | G01R 33/3403 |
| | | | | 324/318 |
| 8,362,774 B2* | 1/2013 | Katsunuma | ........ | G01R 33/3403 |
| | | | | 324/309 |
| 10,739,427 B1* | 8/2020 | Yang | ................... | G01R 33/3858 |
| 11,125,842 B2 | 9/2021 | Wang et al. | | |
| 2014/0302258 A1 | 10/2014 | Mathieu et al. | | |
| 2016/0219370 A1* | 7/2016 | Moro | ..................... | H04R 9/027 |
| 2017/0192067 A1* | 7/2017 | Garcia | ............... | G01R 33/3403 |

* cited by examiner

RADIO FREQUENCY COIL ASSEMBLIES FOR MAGNETIC RESONANCE IMAGING SYSTEMS AND METHODS FOR MAKING THEM

FIELD

The present disclosure generally relates to radio frequency (RF) coil assemblies and methods for making them, and more particularly to RF coil assemblies and methods for making them for magnetic resonance imaging systems.

BACKGROUND

This section includes discussion intended to help understand various aspects of the subject matter presently disclosed below. This discussion should not be interpreted as constituting an admission of prior art.

Modern magnetic resonance imaging (MRI) systems provide imaging based on the effects of introducing electromagnetic waves (e.g., a radio frequency signal) and various magnetic fields on an object such as a patient. An MRI system may include a primary coil assembly (or primary magnet) that generates a primary magnetic field, one or more gradient coils that interact with the primary magnetic field to produce magnetic gradients, a radio frequency (RF) transmitter that outputs a RF signal into the magnetic field, and an RF receiver that receives the RF signal as it passes through the primary magnetic field. The RF transmitter and receiver may also be referred to collectively as an RF transceiver, antennae, or body coils. The MRI system then generates image data as a visual representation of the object based on the effects that these RF signals and magnetic fields have on the object.

It will be recognized that the components involved in generating, transmitting, and/or receiving the RF signals and magnetic fields typically generate heat during use. Various regulatory and safety requirements are imposed to ensure that the heat generated by these and other components do not result in patient injury or unstable equipment. Accordingly, MRI systems also include various cooling components to provide cooling for these components in use.

SUMMARY

This Summary is provided to introduce a selection of concepts that are further described below in the Detailed Description. This Summary is not intended to identify key or essential features of the claimed subject matter, nor is it intended to be used as an aid in limiting the scope of the claimed subject matter.

One aspect of the present disclosure generally relates to an RF coil assembly for a magnetic resonance imaging (MRI) system. The RF coil assembly includes a support structure extending between a first end and a second end in a first direction and extending between an inner surface and an opposite outer surface in a second direction perpendicular to the first direction. The support structure has channels that extend into the support structure in the second direction. An RF coil configured to transmit and/or receive RF signals, where the RF coil is supported by the outer surface of the support structure. The channels are at least partially positioned between the support structure and the RF coil in the first direction. The channels are configured to convey a cooling medium to cool the support structure in use. The cooling medium includes forced air flow or forced cooled-air flow. The salient aspect of the invention relates to providing a structure whereby the RF coil assembly can be efficiently cooled to maintain temperature stability.

In certain examples, the support structure is cylindrically shaped and the channels extend radially inwardly from the outer surface of the support structure.

In certain examples, where the channels are separate annular channels. In further examples, the separate annular channels are formed to be parallel to each other.

In certain examples, the support structure extends a length between the first and second ends in the first direction, wherein the channels together span a distance in the first direction, and wherein the distance that the channels span is less than 50% of the length between the first and second ends of the support structure. In further examples, the RF coil extends a length between first and second ends thereof in the first direction, and the distance that the channels span is between 50% and 200% of the length of the RF coil.

In certain examples, the support structure comprises a base portion and a standoff portion, the standoff portion is positioned between the base portion and the RF coil, and the channels are at least partially defined by the standoff portion.

In certain examples, the support structure comprises a base portion and a standoff portion, the standoff portion is positioned between the base portion and the RF coil, and the channels are each positioned between the standoff portion and the base portion.

In certain examples, the cooling medium is air, further comprising a fan for circulating the air within the channels.

Another aspect according to the present disclosure generally relates to a method for making an RF coil assembly for a magnetic resonance imaging (MRI) system. The method includes providing a support structure that extends between a first end and a second end in a first direction and extends between an inner surface and an opposite outer surface in a second direction perpendicular to the first direction. Channels are provided within the support structure, the channels each being closer to the outer surface than to the inner surface in the second direction. The method further includes positioning an RF coil so as to be supported by the outer surface of the support structure, and such that the channels are at least partially positioned between the RF coil and the support structure in the first direction. The RF coil is configured to transmit and/or receive RF signals. The channels are configured to convey a cooling medium to cool the support structure in use.

In certain examples, the method further includes machining the outer surface of the support structure to provide the channels therein.

In certain examples, the method further includes machining the outer surface of the support structure such that each of the channels forms a separate, annular channel.

In certain examples, the method further includes machining the outer surface of the support structure such that the channels are formed by a helical channel winding around the support structure.

In certain examples, the support structure extends a length between the first and second ends in the first direction, the method further including providing the channels to together span a distance in the first direction that is less than 50% of the length between the first and second ends of the support structure.

In certain examples, the method further includes positioning the RF coil so as to be centered in the first direction relative to the channels.

In certain examples, the method further includes forming the support structure by coupling a standoff portion to an outer surface of a base portion, positioning the RF coil on the standoff portion when positioning the RF coil so as to be supported by the outer surface of the support structure.

In certain examples, the method further includes positioning the RF coil on the standoff portion such that the RF coil at least partially forms the channels.

In certain examples, the method further includes operatively coupling a fan to blow air as the cooling medium within the channels.

In certain examples, the method further includes positioning one or more circular or tubes positioned within the channels, and fluidly coupling a pump to the one or more tubes and configuring the pump to circulate a liquid through the one or more tubes in the channels to cool the support structure in use.

Various other features, objects and advantages of the disclosure will be made apparent from the following description taken together with the drawings.

BRIEF DESCRIPTION OF THE DRAWINGS

The present disclosure is described with reference to the following drawings.

DETAILED DISCLOSURE

The present disclosure generally relates to radio frequency (RF) coil assemblies and methods for making them, and more particularly to RF coil assemblies and methods for making them for magnetic resonance imaging (MRI) systems. As will be discussed further below, these RF coil assemblies may be integrated within MRI systems otherwise similar to those presently known in the art, for example the 3.0T SIGNA™ MR produced by GE Healthcare®.

Figure 1:
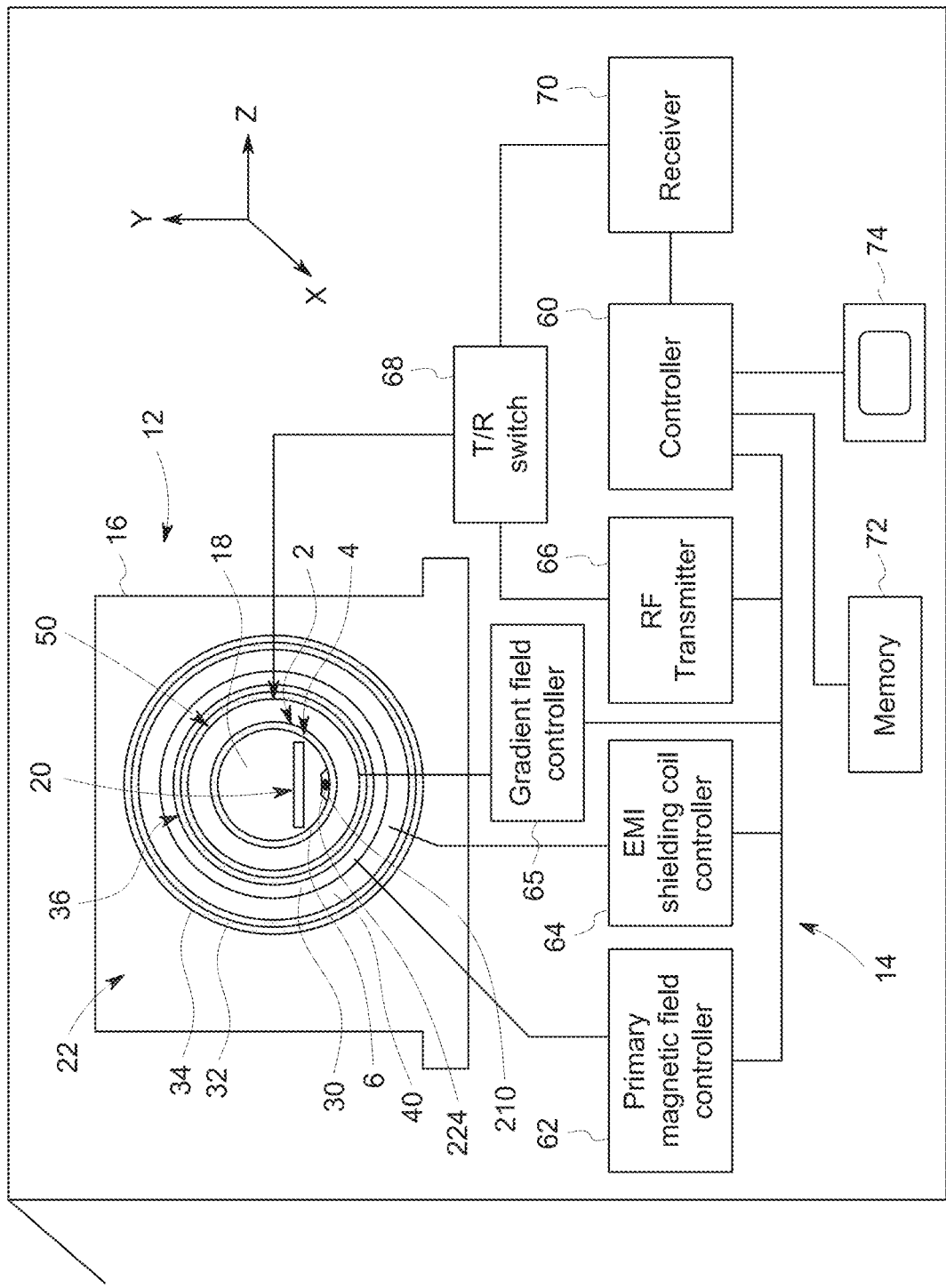
FIG. 1 is schematic view of an MRI system according to the present disclosure.

FIG. 1 shows an MRI system 10 incorporating an RF coil assembly 2 according to the present disclosure. The MRI system 10 includes an imaging portion 12 and a processing portion 14 configured for processing the data received from the imaging portion 12 in a manner presently known in the art. The imaging portion 12 of the MRI system 10 is generally supported within a housing 16. The components of the imaging portion 12 are supported within the housing 16 so as to generally surround a bore 18 of the MRI system 10.

The bore 18 is configured such that an object may be positioned therein for imaging, such as a human patient 19 laying on a patient table 20.

A magnet system 22 within the imaging portion 12 is supported within the housing 16, which includes a primary coil assembly 30 and an EMI shielding coil assembly 40. The primary coil assembly 30 has one or more coiled sections of a conductive material (e.g., a metallic wire) that are wrapped around a support structure, shown as the coil-form, in a manner known in the art. The primary coil assembly 30 is configured to produce a static, stable, and spatially uniform magnetic field (also referred to as a BO field) across the bore 18 in a manner known in the art.

The EMI shielding coil assembly 40 is also comprised of one or more coil sections formed of a conductive material (e.g., a metallic wire) that are wrapped around a coil-form in a manner known in the art. The EMI shielding coil assembly 40 is configured to shield or protect the BO field produced by the primary coil assembly 30 from low frequency electromagnetic interference (EMI). By way of example, sources of low frequency EMI include nearby traffic, parking lots, or moving metallic items that create magnetic flux near the MRI system, which disturb the uniformity of the BO field if not mitigated against. The conductive materials of both the primary coil assembly 30 and the EMI shielding coil assembly 40 are configured to be superconducting in use. When superconducting, these coils have near-zero resistance and thus very high current. This in turn generates strong magnetic fields for providing high quality images.

As shown in FIG. 1, the primary coil assembly 30 and the EMI shielding coil assembly 40 are surrounded by a cryostat vessel 32 that is filled with liquid helium under vacuum. The liquid helium is used to maintain temperatures in the primary coil assembly 30 and in the EMI shielding coil assembly 40 at near absolute zero. These low temperatures enable the superconducting capability through the primary coil assembly 30 and likewise through the EMI shielding coil assembly 40. The outer surface of the cryostat vessel 32 is surrounded by thermal insulation 34 in a manner known in the art so as to maximize cooling of the primary coil assembly 30 and the EMI shielding coil assembly 40. Additional thermal insulation may also be provided between the primary coil assembly 30 and the EMI shielding coil assembly 40 to generally prevent thermal communication therebetween, subject to an important exception discussed below.

The MRI system 10 of FIG. 1 includes additional coil assemblies supported within the housing 16 that provide various functions presently known in the art. These additional coil assemblies 50 may include gradient magnet coils 52 as well as active shims, passive shims, and bucking coils. These additional coil assemblies 50 include one or more coil sections that collectively generate a magnetic gradient within the BO field generated by the primary coil assembly 30 along any of the three X, Y, and Z axes.

The MRI system 10 of FIG. 1 further includes an RF coil assembly 2 according to the present disclosure. In certain examples, the RF coil assembly 2 includes one or more RF coils 4 and a support structure that supports the RF coils 4, such as a coil-form 6 about which the RF coils 4 are wound. The RF coil 4 may be configured in a manner presently known in the art, which may also be referred to as a "bird-cage. The RF coil assembly 2 of the present embodiment is configured to both transmit and receive radio frequency (RF) signals. In particular, RF signals are transmitted from the coils 4 into the bore 18, and RF signals are received from the bore 18 via the RF coils 4. In other embodiments, separate coils may be used for transmitting and receiving the RF signals. The RF signals received by the RF coil 4 are then processed by the processing portion 14 to generate the image data representing the object in the bore 18 of the MRI system 10 in a manner known in the art.

The processing portion 14 of the MRI system 10 also includes a controller 60, a primary magnetic field controller 62, an EMI shielding coil controller 64, a gradient field control 65, an RF transmitter 66, an RF transmit-receive (T-R) switch 68, an RF receiver 70, a memory system 72, and a display device 74. The controller 60, particularly via the primary magnetic field controller 62, controls the flow of current through the primary coil assembly 30 to thereby control the strength of the electromagnetic BO field in the bore 18. Similarly, the controller 60 controls the flow of current through the EMI shielding coil assembly 40 via the EMI shielding coil controller 64, and the flow of current through the magnetic gradient coils 52 via the gradient field controller 65. Specific mechanisms for controlling the primary coil assembly 30, the EMI shielding coil assembly 40, and other components discussed above are generally known in the art.

With respect to the sending and receiving of RF signals, the T-R switch 68 selectively electrically couples the RF coil 4 to the RF transmitter 66 and to the RF receiver 70. The controller 60, via the T-R switch 68, causes radio frequency (RF) field pulses to be generated by the RF transmitter 66. These RF pulses cause excitation of the magnetic resonance within the object within the bore 18 by the magnetic fields. In certain embodiments, the RF transmitter 66 generate signals at resonate frequencies centered around the Larmor frequencies of a proton (hydrogen nuclei, 1H) and/or carbon (e.g., a 13C nuclei). The RF receiver 70 is disconnected by the T-R switch 68 while these RF excitation pulses are being generated. The T-R switch 128 then disconnects the RF coil 4 from the RF transmitter 66 and to connects the RF receiver 70 to the RF coil 4. This enables the RF receiver 70 to receive the magnetic resonance signals resulting from the excited nuclei in the object caused by the RF excitation pulses. These magnetic resonance signals are received by the controller 60, which via processing techniques presently known in the art are used to produces an image of the object.

Figure 2:
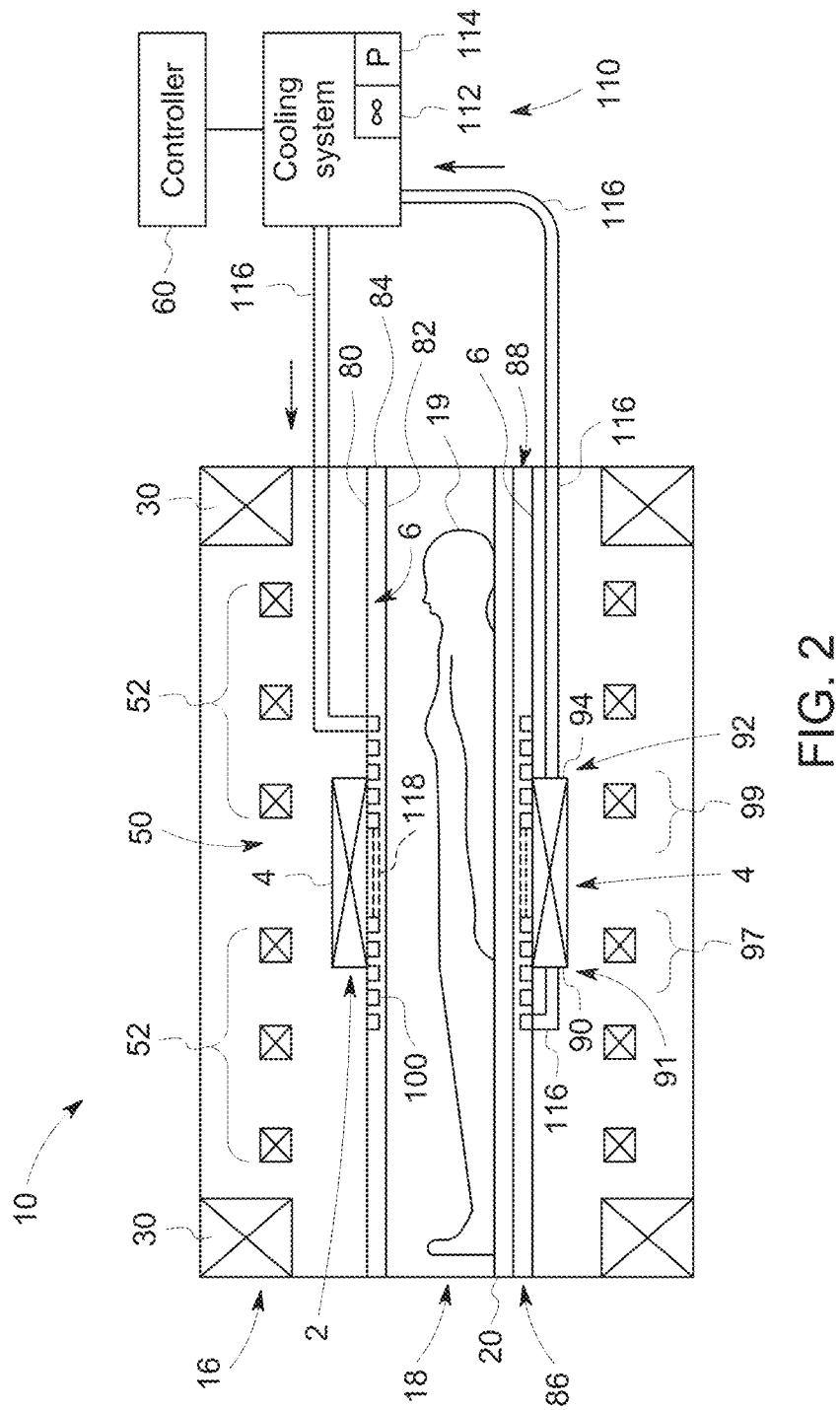
FIG. 2 is a sectional side view of an MRI system according to the present disclosure.

FIG. 2 is a sectional view of an MRI system 10 showing an RF coil assembly 2 according to the present disclosure. In this example, the RF coil assembly 2 includes one or more RF coils 4 of conductive material that are wrapped directly around the coil-form 6. The coil-form 6, also referred to as a support structure, is generally cylindrical and extends between a first end 86 and a second end 88 along a length 87 in a first direction. The coil-form 6 has an outer surface 80 and an inner surface 82 with a thickness 84 therebetween defined in a second direction perpendicular to the first direction. The coil-form 6 may be formed of fiber reinforced glass epoxy resins and/or other composite materials presently known in the art.

Figure 3:
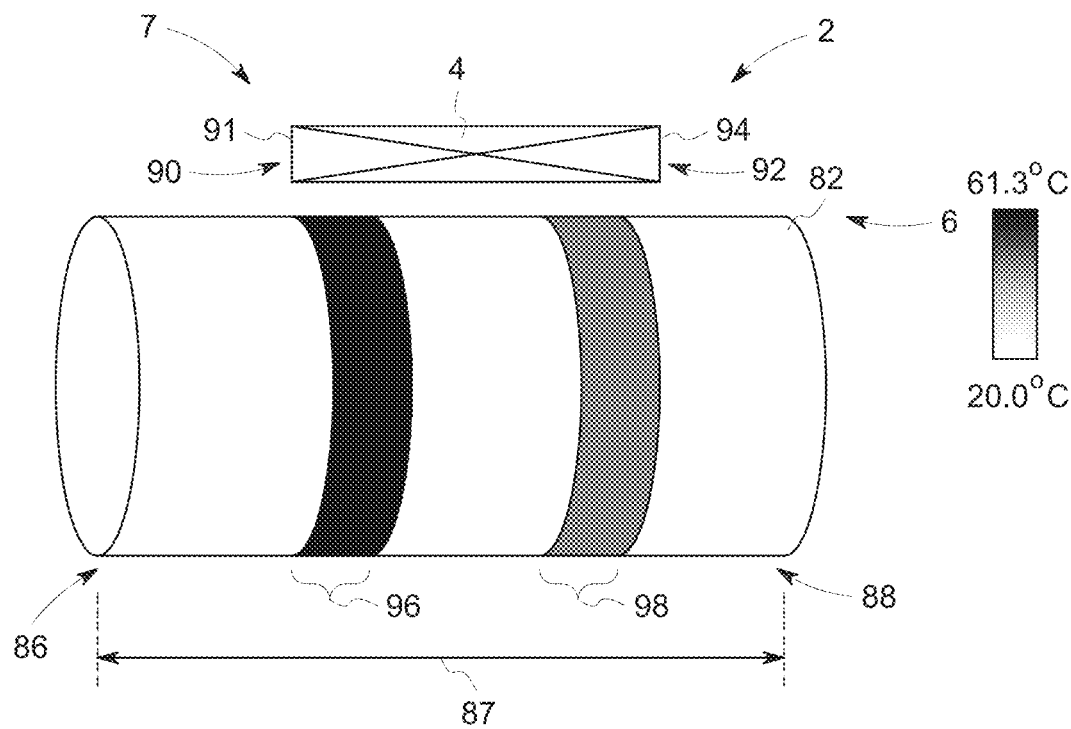
FIG. 3 is a temperature map of an inner surface of a coil-form for an MRI system.

FIG. 3 depicts experimental data collected by the present inventors showing the heat generated within the MRI system 10 from operating the RF coil 4 in transmitting and receiving RF signals during imaging. In particular, FIG. 3 shows a temperature map 7 of the inner surface 82 of the coil-form 6 at different positions along the length 87 between the first end 86 and the second end 88. A partial sectional view of the RF coil 4 is also shown superimposed next to the temperature map 7. The RF coil 4 extends between a first end 90 and a second end 92 to end rings 91, 94. In this manner, FIG. 3 shows the locations of the end rings 91, 94 relative to the coil-form 6. The temperature map 7 shows that the regions 96, 98 of the inner surface 82 that are aligned axially with the end rings 91, 94 of the RF coil 4 have a greater temperature than the remainder of the coil-form 6. By way of example, there are a few heat generation sources that could affect the inner surface 82 of the support structure. The end rings 91, 94 may generate heat via RF or eddy currents, as well as the gradient coil itself. The RF of the end rings 91, 94 may generate the greatest peak temperatures for the support structure. The present inventors have identified that providing cooling from the outside of the coil-form 6, as presently known in the art, is not efficient. In particular, the outer surface along the total length of the support structure must be cooled in order to reach to those peak temperature locations from the end of the support structure. Moreover, that air will be removing heat from the inner diameter of the gradient coil.

With reference to FIGS. 2 and 3, the present inventors have identified that the end rings 91, 94 of the RF coil 4 generate substantial heat from the transmission of RF signals, and also from eddy currents caused by the rapid changes in the magnetic field generated by operating the RF coil 4, or the gradient coils 52. By way of example, the input power to the end rings 91, 94 for transmitting these RF signals may be 200 W, thereby serving as a substantial heat source. Eddy currents generated by the fast switching of the linear magnetic field gradients induced in the RF coil structures including end rings 91, 94 may also contribute to substantial heat generation and temperature rise.

As discussed above, the coil-form 6 is among the components of the MRI system 10 closest to the patient 19 within the bore 18. Therefore, the temperature at the inner surface 82 of the coil-form 6 is of great importance for patient safety and regulatory compliance, both in terms of peak temperature and average temperature. When the peak temperature or average temperature rises beyond acceptable threshold limits, MRI systems presently known in the art are de-rated (power to the coils is reduced) to reduce this temperature. However, this also reduces the performance of the system in providing high image quality. By way of example, these threshold limits may be 41° C. peak temperature and 25° C. average temperature. Similarly, to minimize the peak or average temperature rises, the magnetic field gradient amplitude and slew rates may need to be de-rated. Both reduce the performance of the MRI system and compromises image quality.

MRI systems presently known in the art attempt to control the temperature by providing cooling for the coil-form, specifically by cooling the annular space between the RF coil and the gradient coil, and/or between the coil-form and the patient. This cooling may be provided as airflow from fans either within the MRI system, or outside the MRI system that use ducts or other conduits to direct the airflow into the MRI system. In a similar manner, cooling may be provided by circulating liquid coolant through conduits positioned in this annular space. Examples of liquid coolant include deionized water, deionized water with a mild algaecide, or glycol.

In certain examples, these conduits are positioned in contact with the outer surface of the coil-form to maximize cooling of the outer surface with the goal of also indirectly cooling the inner surface of the coil-form. Whether through airflow or the circulation of liquid coolant, MRI systems presently known in the art provide cooling along the entire length of the coil-form, starting from one end of the MRI assembly and proceeding to the opposite end. Conventional cooling is not specific to cooling localized regions of temperature rise and may have reduced efficiency.

Through experimentation and development, the present inventors have discovered that the cooling techniques presently known in the art are inefficient and ineffective at achieving the goal of managing the temperature of the coil-form. In particular, significant air flow (or conduit for liquid cooling) is needed to cover the entire outer surface of the coil-form. As shown in the MRI system 10 of FIG. 3, the outer surface of the coil-form 6 is not uniformly heated but is concentrated at the portions aligned with the end rings 91, 94. In view of this, the systems and methods disclosed herein improve upon the cooling of the coil-form 6 in part by specifically providing the cooling at the source of the heat—at the end rings 91, 94 of the RF coil 4.

Figure 4:
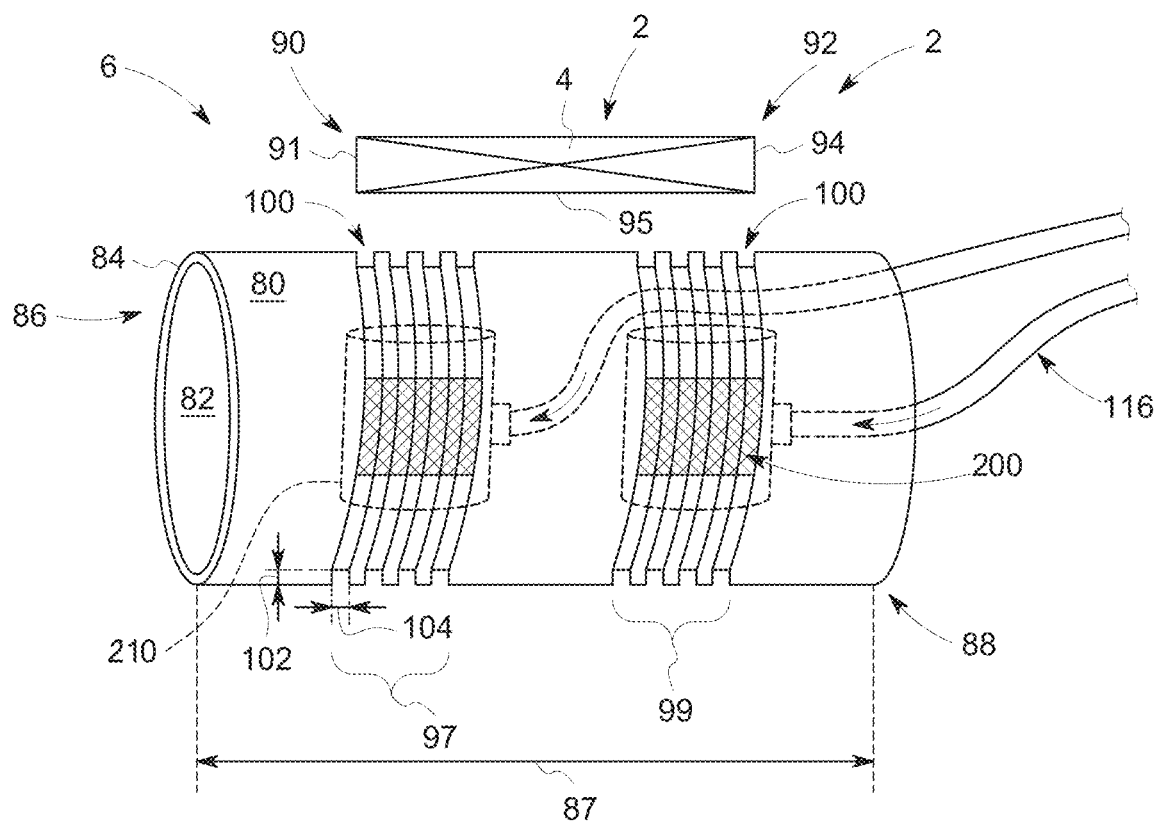
FIG. 4 is an isometric bottom view of an RF coil assembly according to the present disclosure.

FIG. 4 shows a coil-form 6 according to the present disclosure, now separated from the MRI system 10. An RF coil 4 as discussed above is superimposed next to the coil-form 6 to show the axial alignment therebetween. In the example of coil-form 6 shown, channels 100 are formed circumferentially and radially inwardly from the outer surface 8, here having a depth 102, a width 104, and a rectangular cross-section. The depth 102 is less than the thickness 84 of the coil-form 6. In certain examples, the depth 102 is between 2 and 25 mm, between 4 and 12 mm, or between 7 and 10 mm. By way of further example, this depth 102 may be between 25 and 75% of the total thickness 84 of the coil-form 6 (which may have a thickness between 4 and 12 mm, for example). Likewise, examples of widths 104 range from between 3 and 20 mm, or between 7 and 15 mm. The size and shape of each channel 100 may vary from that shown in FIG. 4, for example including cross-sections that are half-circles, squares (see FIG. 5), triangular, and/or shapes. Likewise, the present disclosure contemplates configurations having different numbers and/or densities of channels 100 along the length 87 of the coil-form 6.

The channels 100 are defined in a first region 97 and in a second region 99 along the length 87 of the coil-form 6. The first region 97 and the second region 99 generally align with the first region 96 and the second region 98 in which the most heat is generated from the first and second end rings 91, 94, respectively, of the RF coil 4. In the example of FIG. 4, which may be configured to cool via air, the channels 100 are defined parallel to each other with the RF coil 4 serving as a top cover to enclose each channel 100 when the RF coil 4 is positioned thereon. It should be recognized that other covers may be positioned between the outer surface of the coil-form 6 and the RF coil 4 to enclose each channel 100, such as a film or thin material, for example. Each channel 100 is provided with cooling air via a manifold 210 and conduits 116. Additional details relating to the example of FIG. 4 are provided below.

In certain examples, the first region 97 and the second region 99 have a combined lengths of less than 80%, less than 75%, less than 66%, less than 50%, less than 33%, or less than 25% of the length 87 of the coil-form 6. In certain cases, the combined lengths of the first region 97 and the second region 99 are between 50% and 200% of a length 95 between the first and second ends 90, 92 of the RF coil 4. Similarly, the first region 97 and the second region 99 of the coil-form 6 having the channels 100 may span the same axial length as each other, and/or generally correspond to the lengths of the first region 96 and the second region 98 of increased heat in the temperature map 7 of FIG. 3. In this manner, the channels 100 are generally positioned where the temperature map 7 demonstrated there to be increased temperatures relative to the remaining portion of the inner surface 82 of the coil-form 6.

In certain examples, the channels 100 may be formed within the outer surface 80 of the coil-form 6 via machining. In other examples, the coil-form 6 may be fabricated or otherwise formed to already having the channels 100 extending radially inwardly from the outer surface 80. Similarly, in certain examples the channels 100 are formed as separate, annular channels that are parallel to one another and coaxially aligned with the center axis of the coil-form 6. In other examples, the channels 100 within a given region (i.e., the first region 97) are formed as a single, connected, helical formation (encircling the outer surface 80 of the coil-form 6. In this case, the channels 100 are such that the channels 100 are connected together in series.

In each case, the channels 100 are configured to convey a cooling medium to cool the outer surface 80 of the coil-form 6 specifically within the regions most heated by the RF coil 4. With reference to FIG. 2, the channels 100 are fluidly coupled to a cooling system 110 that conveys the cooling medium to and from the channels 100 and also cools the medium through a heat exchange and extraction system. It should be recognized that since the RF coil 4 does not itself cover all channels 100, the channels 100 are covered in another manner or have separate, enclosed conduits 116 positioned therein (as shown). The cooling system 110 may include one or more fans and related ductwork (collectively shown as reference 112) and/or a pump and reservoir system 114 for conveying air or liquid coolant as the coolant medium, respectively. The cooling system 110 may be positioned inside the casing of the MRI system 10, or positioned outside of the casing (which may be inside or outside the room in which the MRI system 10 is installed). The cooling system 110 may be controlled via the controller 60 discussed above in conjunction with FIG. 1, or another control system similar to that used for cooling coil-forms 6 as presently known in the art.

In the example of FIG. 2, the cooling system 110 is sufficiently far from the channels 100 to require conduits 116 extending between the cooling system 110 and the channels 100 for conveying the cooling medium. The configuration of FIG. 2 is further configured such that the channels 100 are formed together as a single helical groove within each of the first and second regions 97, 99. Additionally, the channel 100 of the first region 97 nearest the second region 99 is fluidly coupled thereto via a connection conduit 118 providing flow between the first and second regions 97, 99. By way of example, the connection conduit 118 may be positioned within another channel in the coil-form 6 or a tube fluidly coupling two of the channels 100 in the first and second regions 97, 99. This allows a single conduit 116 to provide the in-flow from the cooling system 110 to the coil-form 6 (here via the second region 99), as well as a single conduit 116 to provide the out-flow from the coil-form 6 back to the cooling system 110 (here exiting the coil-form 6 at the last of the channels 100 within the first region 97).

Figure 5:
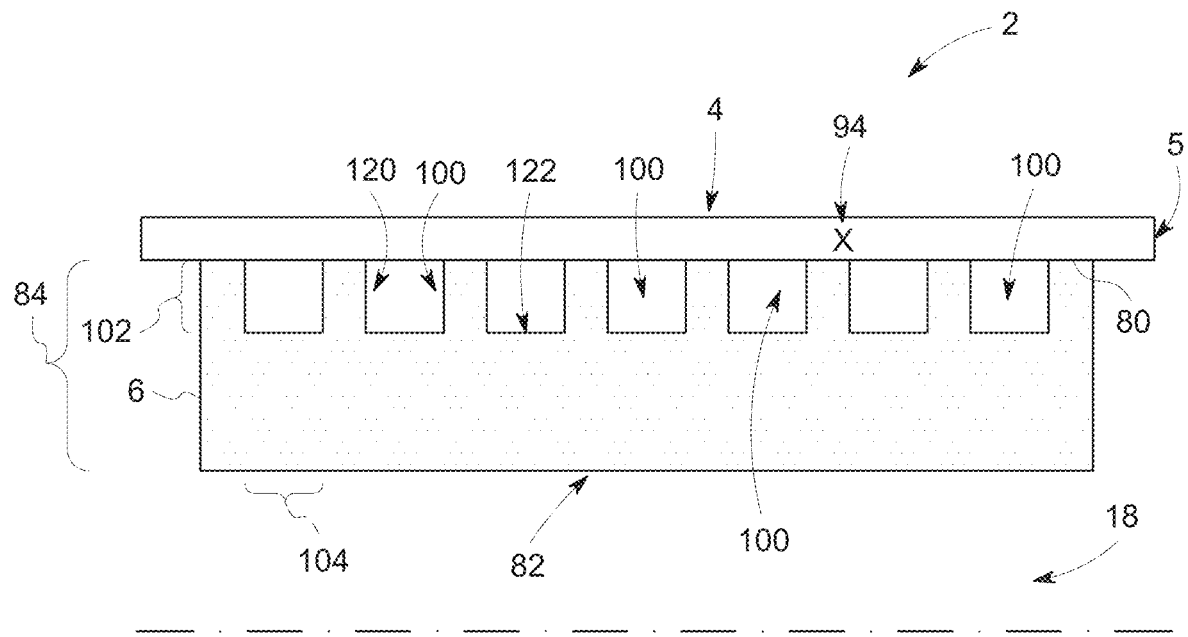
FIG. 5 is a close-up side view of an RF coil assembly according to the present disclosure.

FIG. 5 shows an example of RF coil assembly 2 in which the cooling medium directly contacts the channels 100 of the coil-form 6. It should be recognized that only one portion of the coil-form 6 is presently shown, here generally corresponding to the region 99 of FIG. 4. In the case of using air as the cooling medium, one or more fans as described above blow air directly flow across the walls 120 and floors 122 of the channels 100 to cool the coil-form 6. The one or more fans or ductwork 112 may be the same type, or in fact the same fan or fans (and associated ductwork), as that used in MRI systems presently known in the art. In the example of FIG. 1, the one or more fans or related ductwork 112 are shown positioned within the annular space between the RF coil 4 and the magnet system 22 so as to blow air directly into the channels 100 of the coil-form 6. It should be recognized that the fans may also be physically located outside of the imaging room due to potential hazards of ferro-magnetic attraction and loss of performance, which provide airflow inside the MRI system via ductwork in a manner known in the art. In certain examples, airflow from a first fan and/or ductwork 112 is aligned with the channels 100 in the first region 97 of the coil-form 6 (see FIG. 4), and airflow from a second fan and/or ductwork is aligned with the channels 100 in the second region 99 of the coil-form. As discussed below, the fans may be smaller than those required in MRI systems presently known in the art since a significantly smaller portion of the coil-form 6 is being cooled in the presently disclosed RF coil assembly 2. FIG. 5 also demonstrates that the end rings (here showing the end ring 94) need not be at the end 5 of the overall packaging of the RF coil 4.

Figure 6:
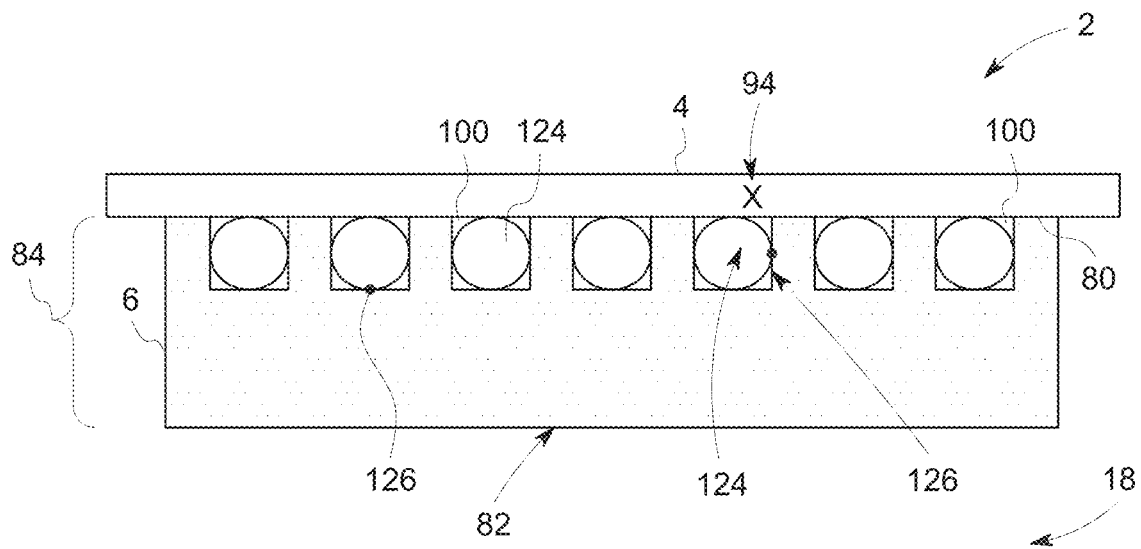
FIG. 6 is a close-up side view of another RF coil assembly according to the present disclosure.

FIG. 6 shows another example of an RF coil assembly 2 according to the present disclosure, now with the cooling medium traveling through conduits 124 (e.g., tubes) positioned within the channels 100. The cooling medium may again be air or a liquid coolant. The conduits 124 may be formed of nylon, PTFE, or other non-ferrous materials, for example. The conduits 124 are fluidly coupled to a fan in the case of air and/or to a pump and reservoir system 114 in the case of a liquid coolant for circulating and cooling the cooling medium. In the configuration of FIG. 6, the coil-form 6 is indirectly cooled via heat transfer between the cooling medium in the conduits 124 and the coil-form 6, specifically via contact with the walls 120 and floors 122 of the channels 100. The conduit 124 may be the same type used for the conduit 106 extending to the cooling system 110 (see FIG. 2), which may be fluidly connected together via quick-disconnect connections for ease of installation and service in the field.

The conduits 124 may be fixed in position within the channels 100 via adhesives 126, for example an epoxy having a high die-electric constant (also referred to as a "high-k" epoxy resin). The adhesives 126 may adhere the conduits 124 to the walls 120, the floors 122, or both. The adhesives 126 may also be chosen to improve the heat exchange between the conduits 124 and the coil-form 6.

It should be recognized that other mechanisms for conveying the cooling medium to the channels 100 are also contemplated by the present disclosure. Likewise, as discussed above, the cooling system 110 may be positioned inside the housing 16, outside the housing 16, or a hybrid thereof. Alternative forms of ducts or manifolds are also contemplated by the present disclosure.

The coil form 6 could be fabricated in a single piece via additive manufacturing methods that are known to the art. In this embodiment, the cooling channels 124 are fabricated directly from the same material of the coil form 6 during the additive manufacturing process. This embodiment obviates the need for additional materials of the conduit as the walls 122 and floors 120 of the channels 100 can directly form the cooling conduit 124. The ability to manufacture or design cooling channels via additive manufacturing is implied for different embodiments as an alternative method of fabrication that achieves the same objectives.

In certain examples, the cooling medium for the channels 100 is conveyed from another cooling system used for cooling other components within the MRI system 10. For example, an airflow or liquid coolant system used for providing cooling the gradient magnet coils 52 may be routed to also provide airflow to the channels 100 in the coil-form 6 of the RF coil assembly 2. In this manner, no additional fans or pumps are required over those already present in the MRI system, saving space, cost, and installation and maintenance time.

Figure 7:
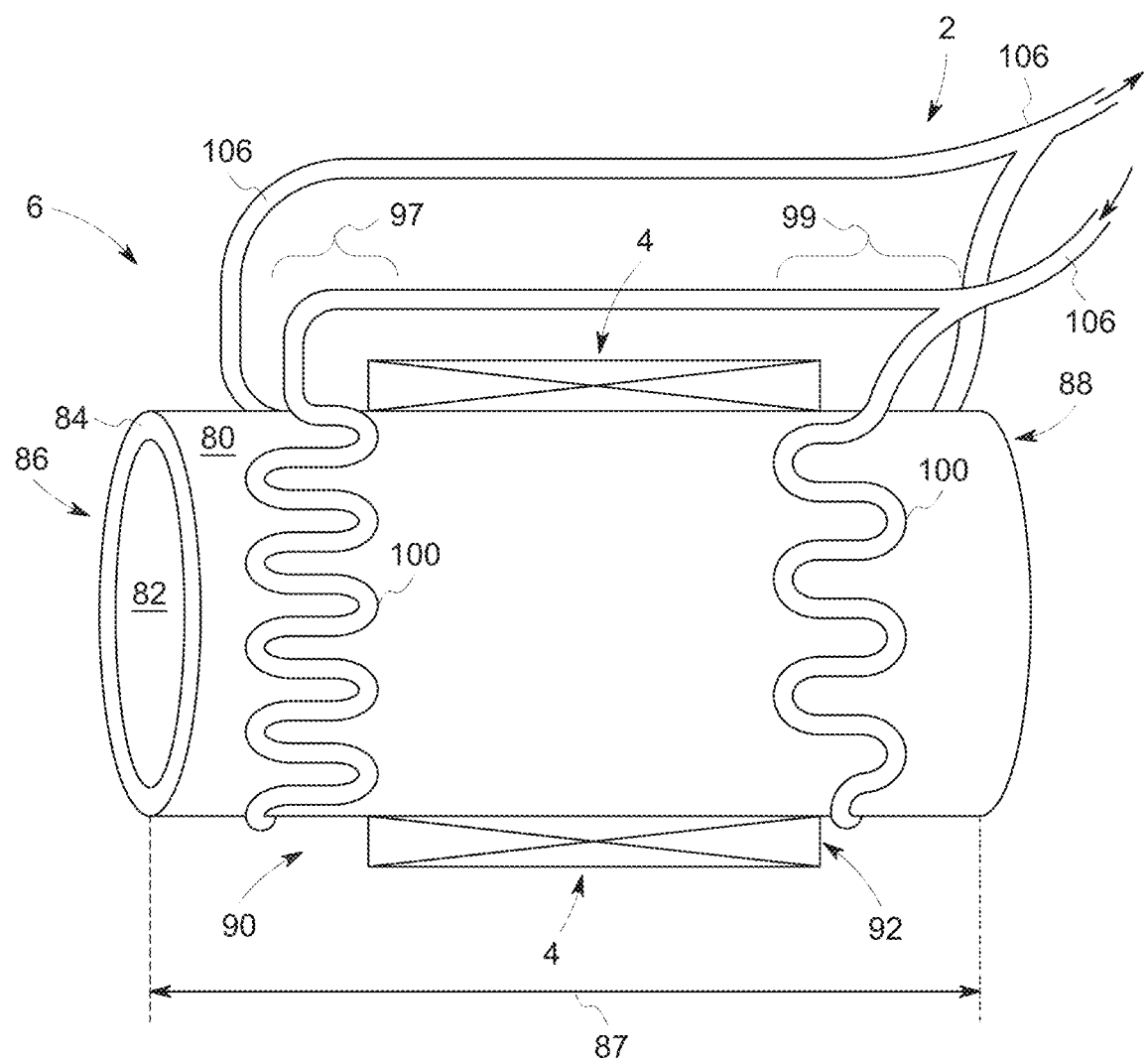
FIG. 7 is an isometric side view of another RF coil assembly according to the present disclosure.

The present disclosure also contemplates configurations in which the channels 100 are not be formed as circumferential rings around the outer surface 80 of the coil-form 6. FIG. 7 shows an RF coil assembly 2 in which the channels 100 are formed as one or more serpentine grooves within the outer surface 80 of the coil-form 6. In this example, a conduit 106 from the cooling system 110 (FIG. 2) includes a splitter to provide separate flows of the cooling medium to the channels 100 in the first region 97 and in the second region 99. In a similar manner, the cooling medium exiting the channels 100 in the first and second regions 97, 99 merges to be returned to the cooling system 110 via a shared conduit 106. Other configurations of channels 100 and conduits 106 are also contemplated by the present disclosure.

The example of FIG. 7 further shows a configuration in which the cooling capacity varies within the first region 97 relative to the second regions 99 within the coil-form 6. In many cases, approximately the same amount of heat generated is at each of the end rings 91, 94. The thermal map 7 of FIG. 3 shows a configuration in which more heat is generated at the end ring 91 at the first end 90 of the RF coil 4 than at the end ring 94 at the second end 92 of the RF coil 4. In view of this, the RF coil assembly 2 of FIG. 7 provides that the serpentine grooves forming the channels 100 in the first region 97 cover a greater surface area of the outer surface 80 than in the second region 99. This can be accomplished by having a greater number of turns, as shown, a larger channel 100 (and/or tubing therein), and/or the like.

Figure 8:
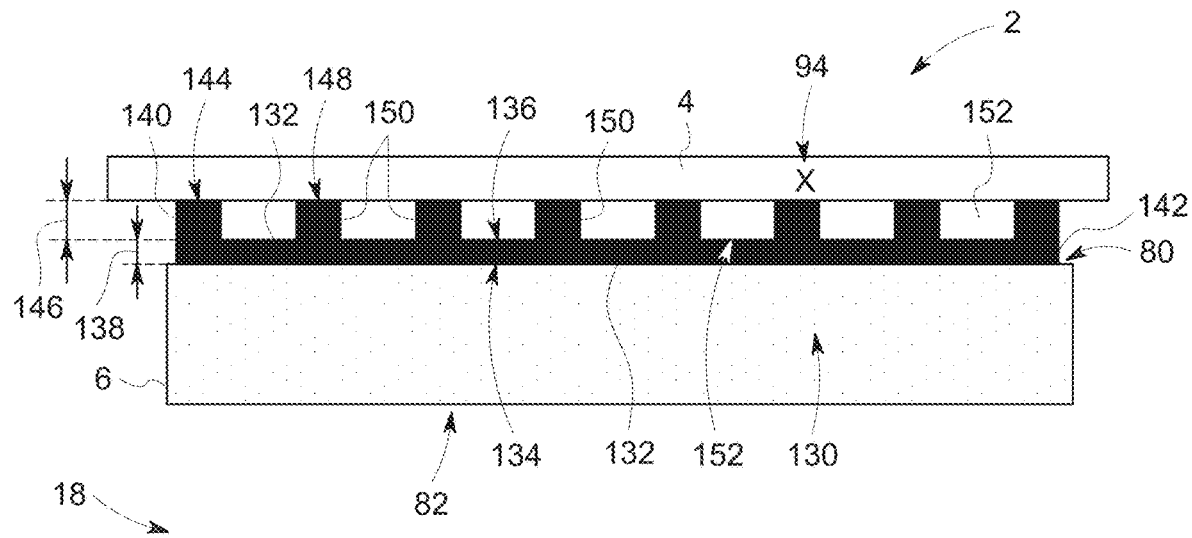
FIG. 8 is a close-up side view of another RF coil assembly according to the present disclosure.

FIG. 8 shows another example of RF coil assembly 2 according to the present disclosure, which in this case provides an alternative approach to machining or otherwise forming the coil-form 6 to have channels 100. The RF coil assembly 2 includes a support lattice 130 that is supported on the outer surface 80 of the coil-form 6 (for example epoxied thereto using high-k epoxy resin). The support lattice 130 has a base 132 that extends from a first end 140 to an opposite second end 142. The base 132 further has a first surface 134 and an opposite second surface 136 with a thickness 138 therebetween. Fingers 144 are formed by walls 150 that extend perpendicularly away from the second surface 136 by a distance 146 to tips 148.

A channel 152 is formed between the walls 150 of adjacent fingers 144, which may otherwise be similar to the channels 100 discussed above. In certain examples, the support lattice 130 is formed of a fiber reinforced glass epoxy resin, which may be the same or different from the material of the coil-form 6. The base 132 and fingers 144 may be integrally formed together, adhered together after separate formation, or otherwise machined or fabricated using techniques known in the art. The fingers 144 may also be referred to as the standoff portion of the support lattice 130. Likewise, the base 132 may also be referred to as the base portion of the support lattice 130. The base 132 and/or fingers 144 may encircle the entire circumference of the coil-form, or be provided at periodic radial intervals defining angular sections to reduce material, cost, and weight (e.g., as spokes extending from a hub).

The tips 148 of the fingers 144 are configured to support the RF coil 4 thereon in a similar manner to how the outer surface 80 of the coil-form 6 supported the RF coil 4 in the examples discussed above. In this manner, the coil-form 6, the support lattice 130, or the combination of the two may also be referred to as a support structure that supports the RF coil 4 in the RF coil assemblies 2 disclosed herein.

The present inventors have recognized that providing the channels 152 in the support lattices 130, rather than directly in the coil-form 6, advantageously allow a coil-form 6 presently known in the art to be cooled according to the present disclosure. This allows for a simpler integration for new MRI systems, and/or opportunities for refurbishing or retrofitting of existing MRI systems. The support lattices 130 may also provide a more cost-effective solution to machining or otherwise forming the coil-form 6 to have the channels 100 formed therein.

Figure 9:
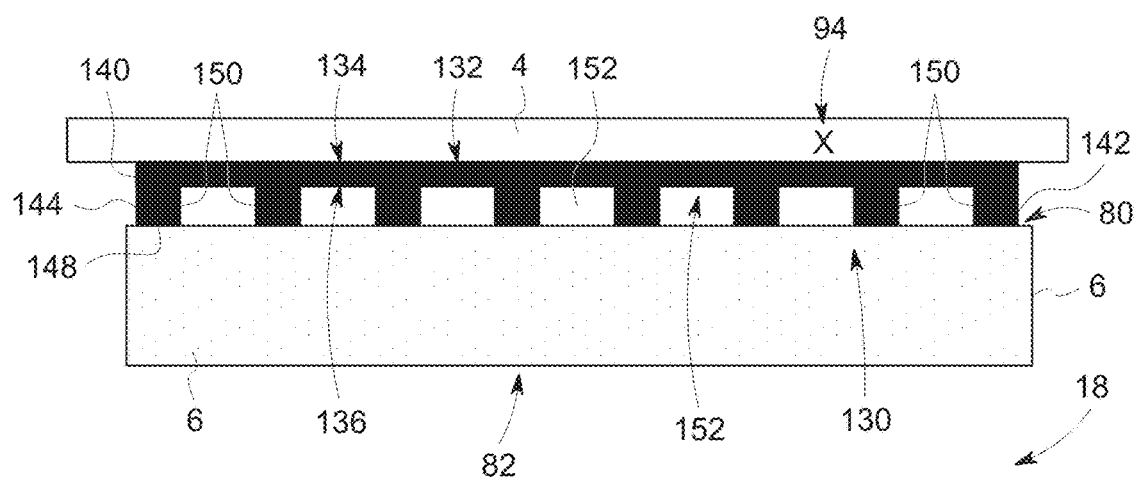
FIG. 9 is a close-up side view of another RF coil assembly according to the present disclosure.
Figure 10:
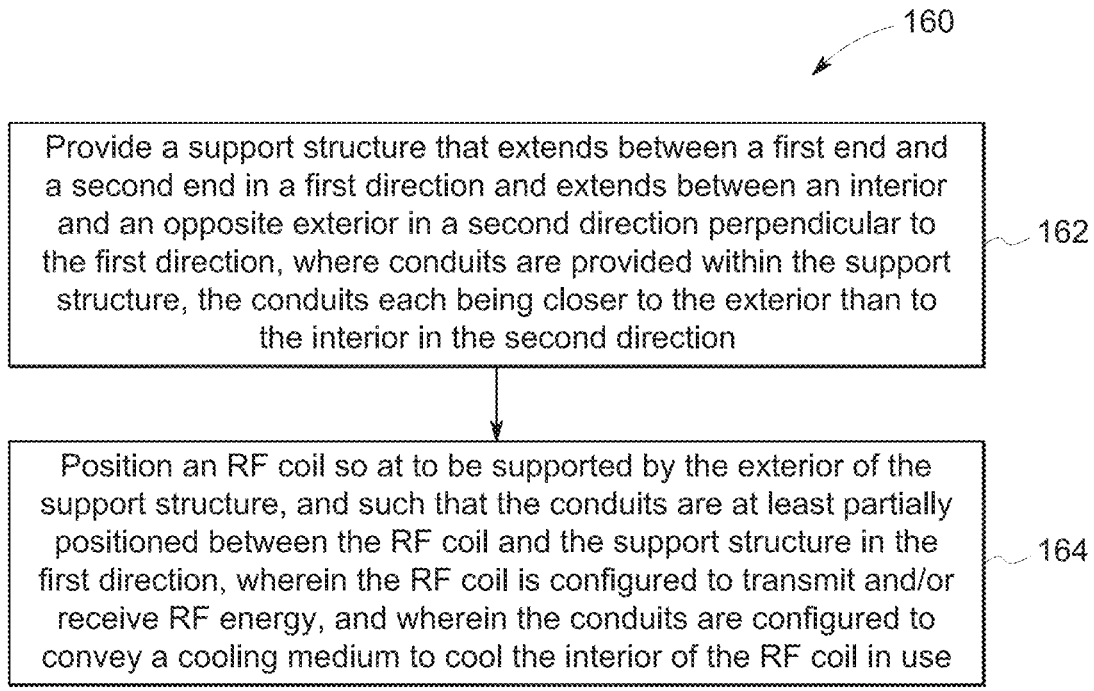
FIG. 10 is a process flow chart for a method of making an RF coil assembly according to the present disclosure.

In the example of FIG. 8, the channels 152 formed between the base 132 and the fingers 144 of the support lattice 130 open radially away from the bore 18 of the MRI system. In contrast, FIG. 9 shows a similar support lattice 130 positioned and supported on the outer surface 80 of the coil-form 6 such that the channels 152 open radially inwardly towards the bore 18. In each case, cooling medium is provided to flow through the channels 152 directly, or via conduits positioned therein (as discussed above and shown in FIG. 6).

FIG. 9 depicts one example of a method 160 for making an RF coil assembly for an MRI system according to the present disclosure, such as those described above. Step 162 provides for providing a support structure that extends between a first end and a second end in a first direction and extends between an inner surface and an opposite outer surface in a second direction perpendicular to the first direction. This support structure may be a coil-form alone, or a coil-form in conjunction with another structure such as a support lattice, as discussed above. Conduits are provided within the support structure, the conduits each being closer to the outer surface than to the inner surface in the second direction. Step 164 provides for positioning an RF coil so as to be supported by the outer surface of the support structure, and such that the conduits are at least partially positioned between the RF coil and the support structure in the first direction. The RF coil is configured to transmit and/or receive RF signals. The conduits are configured to convey a cooling medium to cool the inner surface of the RF coil in use.

Figure 11:
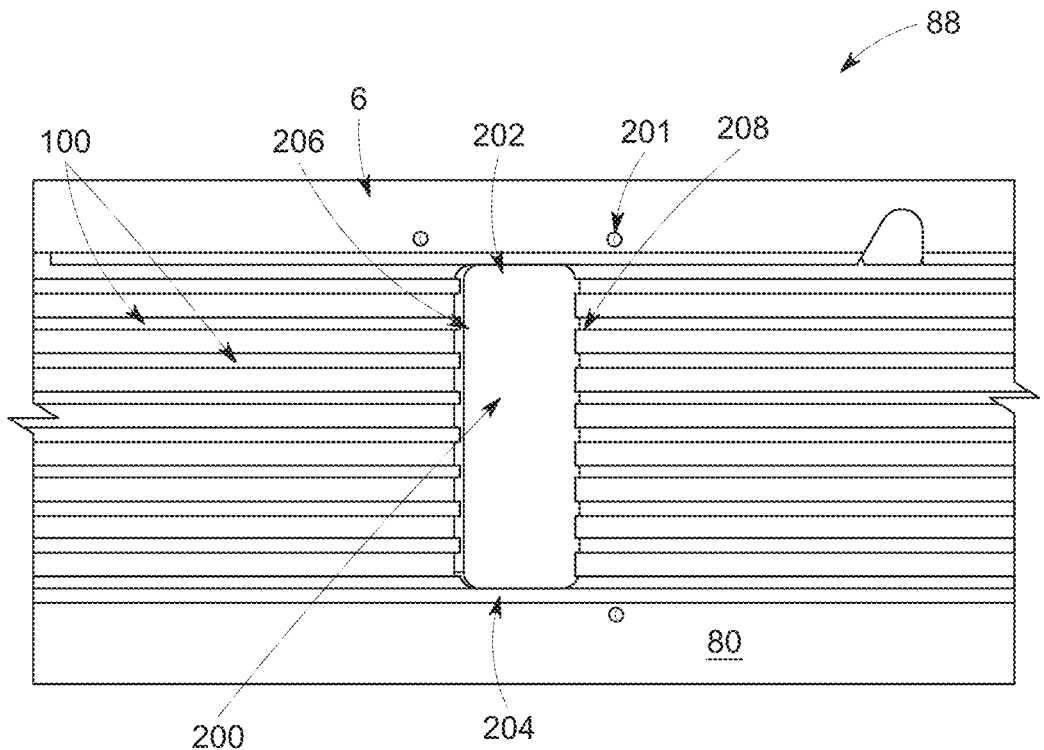
FIG. 11 is a close-up bottom view of the coil-form of FIG. 4.
Figure 12:
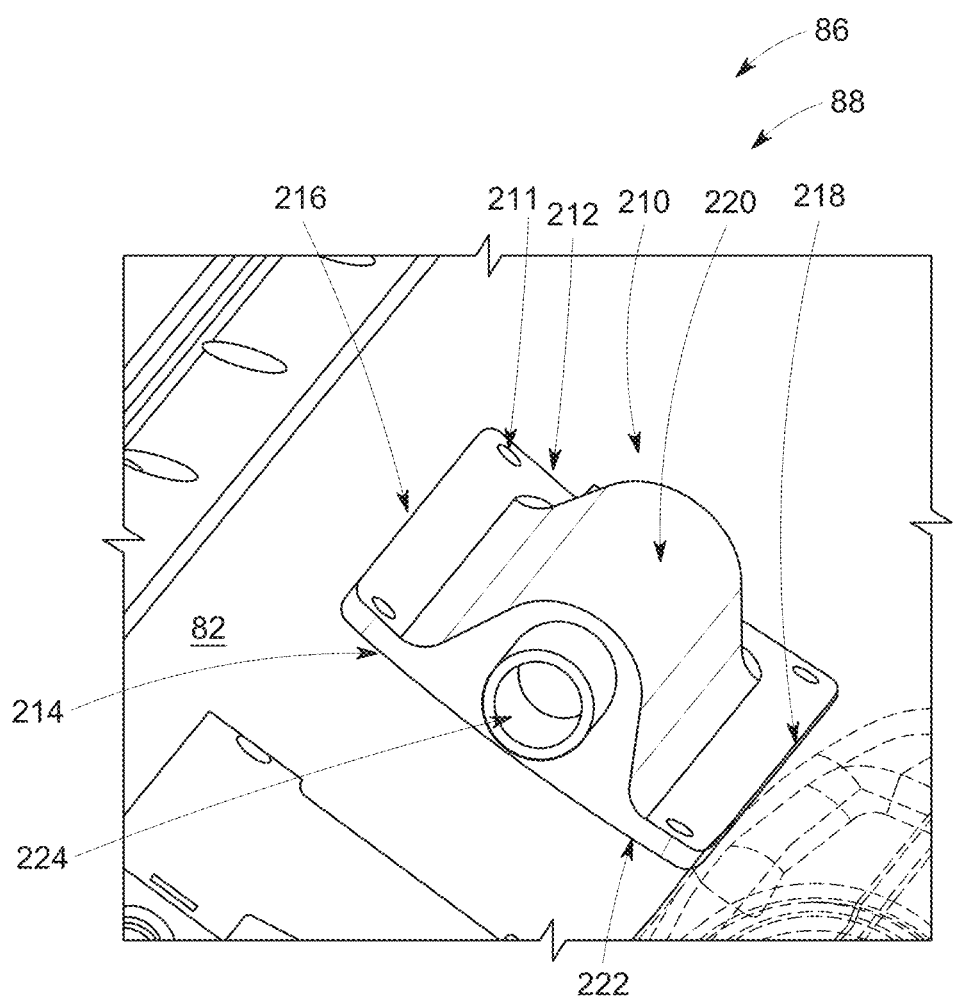
FIG. 12 is an isometric top view of the bottom of an inner surface of the coil-form of FIG. 4.
Figure 13:
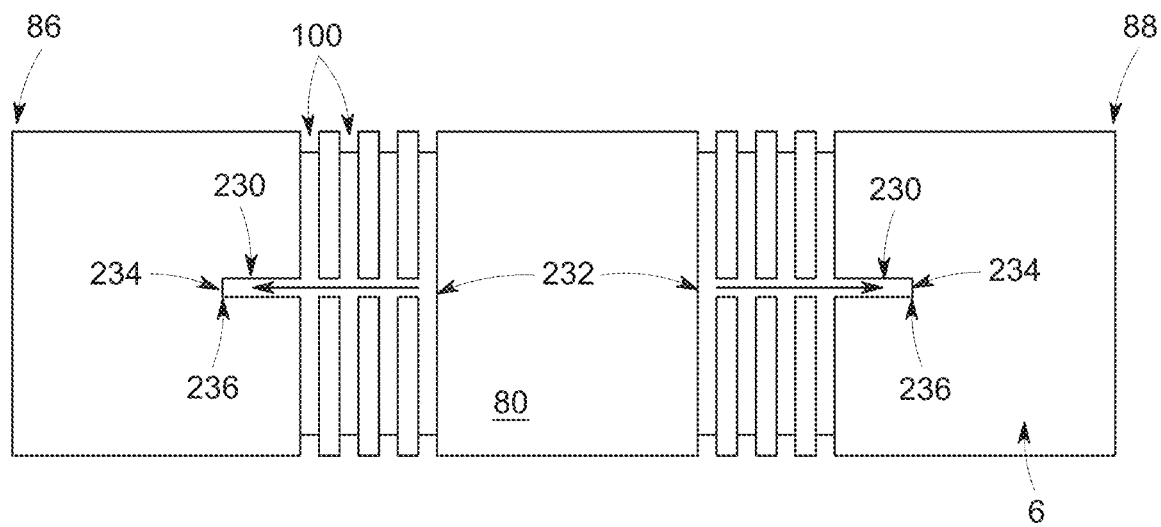
FIG. 13 is a top view of the coil-form of FIG. 4.

Additional details are now provided for the example of FIG. 4 with further reference to FIGS. 11-13. As discussed above, the coil-form of FIG. 4 is configured to be cooled via air. Openings 200 are provided through the coil-form 6, a first opening 200 aligning with the channels 100 in the first region 97 and a second opening 200 aligning with the channels in the second region 99. Each opening 200 extends along a length between a first end 202 and a second end 204, and along a width between a third end 206 and a fourth end 208. Two manifolds 210 are coupled to the inner surface 82 of the coil-form 6 via fasteners within openings 211 (e.g., screws, rivets, or other fasteners known in the art). The manifolds 210 each extend along a length between a first end 212 and a second end 214, along a width between a third end 216 and a fourth end 218, and between a top 220 and bottom 222. The lengths of the manifolds 210 are aligned with the lengths of the openings 200. In certain examples, the openings 200 are positioned at the bottom of the coil-form 6, allowing the manifolds 210 (which are inside the coil-form 6) to be obscured below the patient table 20, as shown in FIG. 1.

With continued reference to FIGS. 4 and 13, air enters the manifold via a port 224 connected to conduits (discussed above), which is directed perpendicularly across the channels 100 in the coil-form 6. The air then circulates independently through each channel 100 before exiting, here through an exit channel 230 on the opposite side of the coil-form 6 (e.g., above the patient, obscured under a patient cover). FIG. 13 shows an example of an exit channel 230 that extends within the outer surface 80 of the coil-form 6, in particular from a first end 232 to a second end 234 that run perpendicularly to the channels 100. In this manner, all channels 100 within a given region (first region 97 and second region 99) are interconnected such that all air flowing though that region is consolidated and exits together via the corresponding exit channel 230.

It should be recognized that the second ends 234 of the exit channels 230 extend closer to the ends of the coil-form (i.e., the first end 86 and the second end 88, as the case may be) than the outermost channel 100. This is necessary to ensure that the second ends 234 are not covered by the RF coil 4 or other covering device that encloses the channels 100. Therefore, the air enters the coil-form 6 via the manifolds 210 at the inner surface of the coil-form 6 and exits via exit channels 234 on the outer surface of the coil-form 6. It should further be recognized that other locations and configurations of manifolds and exits are also contemplated by the present disclosure.

Through experimentation and calculation, the present inventors have discovered that by cooling only the regions of the coil-form 6 in which the RF coil 4 generates heat that is transferred to the coil-form 6 (those principally aligned with the end rings 91, 94), less cooling is required as compared to configurations presently known in the art. For example, a typical system presently known in the art may require 2 to 2.5 cubic meters of flow per minute to cool the coil-form 6. In contrast, the present inventors have found that cooling only the first and second regions 97, 99 of the coil-form 6 (see FIG. 4) may be accomplished with as little as ⅛ of this flow rate. This enables a smaller fan to be used (or pump and reservoir in the of a liquid coolant), saving space within the MRI system 10 (or for cooling systems external thereto). This also saves cost and provides for reduced sound level when operating the fan or pump. Variable speed fans may also be used for flexibility, such as for balancing sound levels versus cooling demands at a given time.

Likewise, the improved cooling provided by the presently disclosed systems and methods result in lower operating temperatures of the inner surface 82 of the coil-form 6 in use. This improves the safety and regulatory compliance of operating the MRI system 10, along with avoiding the need to de-rate operation of the RF coil 4, primary coil assembly, EMI shielding coil assembly, gradient magnets, and/or shim coils to reduce heat generation.

It should be recognized that while the present disclosure generally focused on MRI systems, and using such systems for imaging patients, other uses are also contemplated. For example, the MRI system may be combined with other types of medical imaging technology, such as Computed Tomography (CT), Positron Emission Tomography (PET), a Single Photon Emission Computed Tomography (SPECT), ultrasound, or any other system for generating images. Additionally, the systems disclosed herein need not be limited to systems for imaging patient (human or animal) but may also be used for security or other purposes (e.g., airport luggage scanners).

The functional block diagrams, operational sequences, and flow diagrams provided in the Figures are representative of exemplary architectures, environments, and methodologies for performing novel aspects of the disclosure. While, for purposes of simplicity of explanation, the methodologies included herein may be in the form of a functional diagram, operational sequence, or flow diagram, and may be described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology can alternatively be represented as a series of interrelated states or events, such as in a state diagram. Moreover, not all acts illustrated in a methodology may be required for a novel implementation.

This written description uses examples to disclose the invention, including the best mode, and also to enable any person skilled in the art to make and use the invention. Certain terms have been used for brevity, clarity, and understanding. No unnecessary limitations are to be inferred therefrom beyond the requirement of the prior art because such terms are used for descriptive purposes only and are intended to be broadly construed. The patentable scope of the invention is defined by the claims and may include other examples that occur to those skilled in the art. Such other examples are intended to be within the scope of the claims if they have features or structural elements that do not differ from the literal language of the claims, or if they include equivalent features or structural elements with insubstantial differences from the literal languages of the claims.

What is claimed is:

1. An RF coil assembly for a magnetic resonance imaging (MRI) system, the RF coil assembly comprising:
    a support structure extending between a first end and a second end in a first direction and extending between an inner surface and an opposite outer surface in a second direction perpendicular to the first direction, wherein the support structure has channels that extend into the support structure in the second direction; and
    an RF coil configured to transmit and/or receive RF signals, wherein the RF coil is supported by the outer surface of the support structure, and wherein the RF coil extends between a first end and a second end in the first direction with a center therebetween;
    wherein the channels are at least partially positioned between the support structure and the RF coil in the first direction, wherein the channels are configured to convey a cooling medium for cooling the support structure in use, and wherein the channels are distributed unevenly in the first direction so as to provide more cooling for the support structure near the first end and the second end of the RF coil than near the center of the RF coil.

2. The RF coil assembly according to claim 1, wherein the support structure is cylindrically shaped and the channels extend radially inwardly from the outer surface of the support structure.

3. The RF coil assembly according to claim 2, wherein the channels are separate annular channels.

4. The RF coil assembly according to claim 3, wherein the separate annular channels are formed to be parallel to each other.

5. The RF coil assembly according to claim 1, wherein the support structure extends a length between the first and second ends in the first direction, wherein the channels together span a distance in the first direction, and wherein the distance that the channels span is less than 50% of the length between the first and second ends of the support structure.

6. The RF coil assembly according to claim 5, wherein the RF coil extends a length between first and second ends thereof in the first direction, and wherein the distance that the channels span is between 50% and 200% of the length of the RF coil.

7. The RF coil assembly according to claim 1, wherein the support structure comprises a base portion and a standoff portion, wherein the standoff portion is positioned between the base portion and the RF coil, and wherein the channels are at least partially defined by the standoff portion.

8. The RF coil assembly according to claim 1, wherein the cooling medium is air, further comprising a fan for circulating the air within the channels.

9. An RF coil assembly for a magnetic resonance imaging (MRI) system, the RF coil assembly comprising:
    a support structure extending between a first end and a second end in a first direction and extending between an inner surface and an opposite outer surface in a second direction perpendicular to the first direction, wherein the support structure has channels that extend into the support structure in the second direction; and
    an RF coil configured to transmit and/or receive RF signals, wherein the RF coil is supported by the outer surface of the support structure;
    wherein the channels are at least partially positioned between the support structure and the RF coil in the first direction, and wherein the channels are configured to convey a cooling medium for cooling the support structure in use; and
    wherein the support structure comprises a base portion and a standoff portion, wherein the standoff portion is positioned between the base portion and the RF coil, and wherein the channels are positioned between the standoff portion and the base portion.

10. An RF coil assembly for a magnetic resonance imaging (MRI) system, the RF coil assembly comprising:
    a support structure extending between a first end and a second end in a first direction and extending between an inner surface and an opposite outer surface in a second direction perpendicular to the first direction, wherein the support structure has channels that extend into the support structure in the second direction;
    an RF coil configured to transmit and/or receive RF signals, wherein the RF coil is supported by the outer surface of the support structure; and
    one or more tubes positioned within the channels;
    wherein the channels are at least partially positioned between the support structure and the RF coil in the first direction, and wherein the one or more tubes are configured to convey a cooling medium comprising a liquid for cooling the support structure in use.

11. A method for making an RF coil assembly for a magnetic resonance imaging (MRI) system, the method comprising:
    providing a support structure that extends between a first end and a second end in a first direction and extends between an inner surface and an opposite outer surface in a second direction perpendicular to the first direction, wherein channels are provided within the support structure, the channels extending into the support structure in the second direction; and
    positioning an RF coil so as to be supported by the outer surface of the support structure, and such that the channels are at least partially positioned between the RF coil and the support structure in the first direction, wherein the RF coil is configured to transmit and/or receive RF signals, wherein the RF coil extends between a first end and a second end in the first direction with a center therebetween, wherein the channels are configured to convey a cooling medium to cool the support structure in use, and wherein the channels are configured to provide more cooling for the support structure near the first end and the second end of the RF coil than near the center of the RF coil.

12. The method according to claim 11, further comprising machining the outer surface of the support structure to provide the channels therein.

13. The method according to claim 12, further comprising machining the outer surface of the support structure such that the channels are separate, annular channels.

14. The method according to claim 12, further comprising machining the outer surface of the support structure such that the channels are formed as a helical channel winding around the support structure.

15. The method according to claim 11, wherein the support structure extends a length between the first and second ends in the first direction, further comprising providing the channels to together span a distance in the first direction that is less than 50% of the length between the first and second ends of the support structure.

16. The method according to claim 11, further comprising forming the support structure by coupling a standoff portion to an outer surface of a base portion, further comprising positioning the RF coil on the standoff portion when positioning the RF coil so as to be supported by the outer surface of the support structure.

17. The method according to claim 16, further comprising positioning the RF coil on the standoff portion such that the RF coil at least partially forms the channels.

18. The method according to claim 11, further comprising operatively coupling a fan to blow air as the cooling medium within the channels.

19. The method according to claim 11, further comprising positioning one or more tubes positioned within the channels, and further comprising fluidly coupling a pump to the one or more tubes and configuring the pump to circulate a liquid through the one or more tubes in the channels for cooling the support structure in use.

20. A method for making an RF coil assembly for a magnetic resonance imaging (MRI) system, the method comprising:
   providing a support structure that extends between a first end and a second end in a first direction and extends between an inner surface and an opposite outer surface in a second direction perpendicular to the first direction, wherein channels are provided within the support structure, the channels extending into the support structure in the second direction; and
   positioning an RF coil so as to be supported by the outer surface of the support structure, and such that the RF coil is centered in the first direction relative to the channels, wherein the RF coil is configured to transmit and/or receive RF signals, and wherein the channels are configured to convey a cooling medium to cool the support structure in use.

* * * * *